(12) United States Patent
Rochette

(10) Patent No.: US 10,079,263 B2
(45) Date of Patent: Sep. 18, 2018

(54) MANUFACTURE OF A CDHGTE MULTISPECTRAL PHOTODIODE ARRAY BY CADMIUM DIFFUSION

(71) Applicant: Commissariat a L'Energie Atomique et aux Energies Alternatives, Paris (FR)

(72) Inventor: Florent Rochette, Saint-Jean de Bournay (FR)

(73) Assignee: COMMISSARIAT A L'ENERGIE ATOMIQUE ET AUX ENERGIES ALTERNATIVES, Paris (FR)

(*) Notice: Subject to any disclaimer, the term of this patent is extended or adjusted under 35 U.S.C. 154(b) by 0 days.

(21) Appl. No.: 15/289,577

(22) Filed: Oct. 10, 2016

(65) Prior Publication Data

US 2017/0104026 A1    Apr. 13, 2017

(30) Foreign Application Priority Data

Oct. 12, 2015 (FR) ...................... 15 02136

(51) Int. Cl.
*H01L 27/146* (2006.01)
*H01L 31/101* (2006.01)
(Continued)

(52) U.S. Cl.
CPC .... *H01L 27/14696* (2013.01); *H01L 27/1461* (2013.01); *H01L 27/14649* (2013.01);
(Continued)

(58) Field of Classification Search
CPC ........... H01L 27/14696; H01L 31/1832; H01L 31/1032; H01L 31/1013;
(Continued)

(56) References Cited

U.S. PATENT DOCUMENTS 5,581,084 A * 12/1996 Chapman .......... H01L 27/14649
250/332
5,861,626 A    1/1999 Chandra et al.
5,880,510 A    3/1999 Cockrum et al.

FOREIGN PATENT DOCUMENTS

EP    0 069 453 A1    1/1983
EP    2 432 033 A2    3/2012

OTHER PUBLICATIONS

French Preliminary Search Report dated Jun. 30, 2016 in French Application 15 02136 filed on Oct. 12, 2015 (with English Translation of Categories of Cited Documents).

(Continued)

*Primary Examiner* — Cuong B Nguyen

(74) *Attorney, Agent, or Firm* — Oblon, McClelland, Maier & Neustadt, L.L.P.

(57) ABSTRACT

A method for manufacturing a multi-spectral photodiode array in a $Cd_xHg_{1-x}Te$ semiconductor layer constituted of pixels, the method including a step of producing a PN junction in each pixel and further includes producing a cadmium-rich structure on the semiconductor layer, structured so that all the pixels are not surmounted by a same quantity of cadmium atoms, this quantity being able to be zero; and inter-diffusion annealing, realizing the diffusion of cadmium atoms from the cadmium-rich structure to the semiconductor layer. Pixels that do not all have the same cutoff wavelength are thereby obtained.

14 Claims, 5 Drawing Sheets

(51) Int. Cl.
*H01L 31/103* (2006.01)
*H01L 31/18* (2006.01)

(52) U.S. Cl.
CPC .... *H01L 27/14698* (2013.01); *H01L 31/1013* (2013.01); *H01L 31/1032* (2013.01); *H01L 31/1832* (2013.01)

(58) Field of Classification Search
CPC ...... H01L 31/0296–31/02966; H01L 27/1461; H01L 27/14649; H01L 27/14698
See application file for complete search history.

(56) References Cited

OTHER PUBLICATIONS

Antoni Rogalski et al., "Third-generation infrared photodetector arrays," Journal of Applied Physics, American Institute of Physics, US, vol. 105, No. 9. May 11, 2009, pp. 44.

Antoni Rogalski et al., "HgCdTe infrared detector material: history, status and outlook"; Report on progress in Physics, Institute of Physics Publishing, Bristol, GB, vol. 68, No. 10, Aug. 22, 2005, pp. 70.

* cited by examiner

MANUFACTURE OF A CDHGTE MULTISPECTRAL PHOTODIODE ARRAY BY CADMIUM DIFFUSION

TECHNICAL FIELD

The invention relates to the field of infrared CdHgTe photodiodes, used to detect infrared radiation, notably for infrared imaging applications. More particularly, it relates to a method for manufacturing a multi-spectral photodiode array.

STATE OF THE PRIOR ART

A photodiode array is called multi-spectral when it has a cutoff wavelength that varies in time or in space.

The cutoff wavelength is the wavelength above which a radiation is no longer detected by the photodiode.

The cutoff wavelength of a CdHgTe photodiode depends on the cadmium concentration.

The document EP 2 432 033 A2 describes two embodiments of a bi-spectral photodiode array made of cadmium, mercury and tellurium alloy of $Cd_xHg_{1-x}Te$ type.

In a first case illustrated in FIG. 6 of this document, the array comprises doublets of two photodiodes mounted head-to-tail, separated by a barrier layer.

A drawback of this embodiment is that it does not make it possible to obtain temporal coherence of bi-spectral detection.

A second drawback is that detection is limited to the bi-spectral.

In a second case illustrated in FIG. 2, the array comprises a $Cd_xHg_{1-x}Te$ layer and a $Cd_yHg_{1-y}Te$ layer, situated one on top of the other and separated by a barrier layer. Trenches locally expose the lower $Cd_yHg_{1-y}Te$ layer, which makes it possible to produce PN junctions in each of these two layers.

A first drawback, which is also found in the first embodiment, is that etching of the trenches creates material defects at the etched interfaces. These defects are behind a dark current as well as an additional noise level for the detector.

A second drawback, which is also found in the first embodiment, is that several growths of crystalline layers of high quality and of variable composition are necessary. It is notably necessary to use growth by molecular beam epitaxy (MBE), this type of growth being more complex than growth by liquid phase epitaxy (LPE).

An objective of the present invention is to propose a multi-spectral photodiode array and an associated manufacturing method, not having one at least of the drawbacks of the prior art.

A first objective of the present invention is to propose a manufacturing method compatible with techniques of growth by LPE in addition to MBE techniques.

A second objective of the present invention is to propose a method for manufacturing a multi-spectral photodiode array of CdHgTe type which has reduced dark current and noise level.

A third objective of the present invention is to propose a method for manufacturing a photodiode array of CdHgTe type offering multi-spectral detection, not limited to the bi-spectral.

DESCRIPTION OF THE INVENTION

This objective is attained with a method for manufacturing a multi-spectral photodiode array in a $Cd_xHg_{1-x}Te$ semiconductor layer constituted of juxtaposed regions called pixels, the method comprising a step of producing a PN junction in each pixel.

The method according to the invention comprises the following steps, implemented at least once:
  deposition of cadmium-rich material on the $Cd_xHg_{1-x}Te$ semiconductor layer, the cadmium-rich material having a cadmium concentration greater than that of the semiconductor layer; then
  inter-diffusion annealing, realising the diffusion of cadmium atoms from the cadmium-rich material to the semiconductor layer;

the at least one step of deposition of cadmium-rich material forming a step of producing a cadmium-rich structure, the cadmium-rich structure being structured so that all the pixels of the semiconductor layer are not surmounted by a same quantity of cadmium atoms, this quantity being able to be zero; and the at least one inter-diffusion annealing being adapted so that at the end of this at least one annealing, all the pixels do not have the same cutoff wavelength.

In other words, it may be considered that the method according to the invention comprises the following steps:
  producing a cadmium-rich structure on the $Cd_xHg_{1-x}Te$ semiconductor layer, structured so that all the pixels are not surmounted by a same quantity of cadmium atoms, this quantity being able to be zero; and
  inter-diffusion annealing, realising the diffusion of cadmium atoms from the cadmium-rich structure to the semiconductor layer, such that at the end of the annealing all the pixels do not have the same cutoff wavelength.

In particular, the semiconductor layer may be structured so that the pixels are surmounted by respective portions of the cadmium-rich structure, having different initial volumes (a volume being defined by a thickness and a section of said portion) and/or concentrations, the volume being able to be zero.

The concentration is called initial concentration to designate the concentration prior to the inter-diffusion annealing. It is a volume concentration.

A pixel may be surmounted by a zero quantity of cadmium atoms. In other words, a pixel may not be surmounted by a portion of cadmium-rich structure.

At the end of annealing, the cadmium atoms of the cadmium-rich structure have migrated totally or in part into the semiconductor layer situated below, locally modifying the cadmium concentration therein. The quantity of cadmium atoms surmounting a pixel before the annealing differs, from one pixel to the next. Consequently, the quantity of cadmium atoms having migrated into a pixel at the end of the annealing differs, from one pixel to the next. Thus, all the pixels do not have the same cutoff wavelength. A multi-spectral photodiode array is thus produced, since each pixel corresponds to a photodiode.

The method according to the invention does not impose an etching step. It thus frees itself from the negative consequences of this etching on the electro-optical performances of the detector produced. It is possible to produce in particular a photodiode array that does not have the dark current and the excess of noise caused by an etching step, that is to say a photodiode array that has a reduced dark current and noise level.

The electro-optical performances are also improved and the manufacturing method simplified due to the fact that the starting point is a single semiconductor layer (a single growth of layer).

The different photodiodes are not superimposed one on top of another, and can thus each detect an infrared radiation simultaneously. A multi-spectral detector with temporal coherence is thus produced.

The invention is not limited to the bi-spectral, and it is easy to produce detectors with more than two different cutoff wavelengths, by means of a plurality of possible dimensions for the portions of cadmium-rich structure.

Finally, the method does not impose a crystalline growth of CdHgTe layer by MBE, since it only implements a single CdHgTe semiconductor layer. A crystalline growth of HgCdTe layer by LPE is possible, with in fine an expected gain in the manufacturing cost of the photodiode array.

According to a first embodiment, the cadmium-rich structure is constituted of portions, each centred on a pixel of the semiconductor layer.

Each portion may have a pad shape, solid at the centre and spaced apart from the other pads.

In a variant, each portion may have a pad shape, open at the centre and spaced apart from the other pads.

According to another variant, the different portions may form together a grid having openings each centred on a pixel.

According to a second embodiment, the cadmium-rich structure is constituted of portions each surmounting a pixel of the semiconductor layer, each portion being decentred relative to the corresponding pixel and several portions being formed of a single piece.

The cadmium-rich structure advantageously has portions of different thicknesses.

In addition or in a variant, the cadmium-rich structure may have portions of different sections.

In addition or in a variant, the cadmium-rich structure may have portions of different initial concentrations.

Preferably, the cadmium-rich structure is constituted of portions each surmounting a pixel of the semiconductor layer, and comprises at least two types of portions which differ by their initial sections, thicknesses and/or concentrations.

Advantageously, the cadmium-rich structure is periodic, and an elementary pattern of the periodic structure extends above a plurality of pixels of the semiconductor layer.

The method according to the invention may comprise several cycles of steps of depositing cadmium-rich material on the semiconductor layer, then inter-diffusion annealing.

The semiconductor layer may have a mesa structure in which trenches separating neighbouring photodiodes extend over the entire height of said semiconductor layer, the method further comprising a metallisation of these trenches, producing an electrical connection between the photodiodes.

In a variant, the semiconductor layer has a mesa structure in which trenches separating neighbouring photodiodes do not extend over the entire height of said semiconductor layer, so as to preserve electrical continuity between the photodiodes.

The invention also relates to a multi-spectral photodiode array obtained by a method according to the invention, in which the semiconductor layer is constituted of at least two types of pixels which differ by their cutoff wavelength.

BRIEF DESCRIPTION OF THE DRAWINGS

The present invention will be better understood on reading the description of examples of embodiment given purely by way of indication and in no way limiting, while referring to the appended drawings in which.

DETAILED DESCRIPTION OF PARTICULAR EMBODIMENTS

For reasons of legibility, scales are not necessarily respected in the figures.

Figure 1:
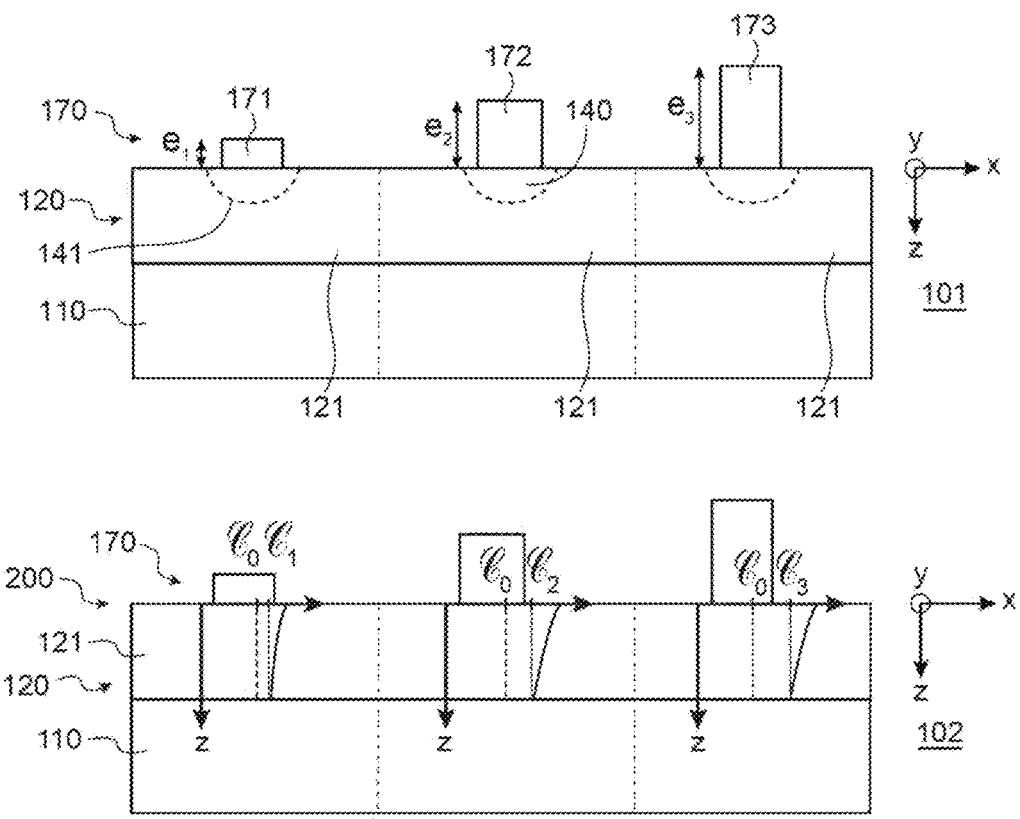
FIG. 1 schematically illustrates a first embodiment of the method according to the invention.

FIG. 1 illustrates a first embodiment of a method according to the invention.

The method according to the invention is intended for the manufacture of a multi-spectral photodiode array, that is to say comprising photodiodes having different cutoff wavelengths. For example, the cutoff wavelengths of two neighbouring photodiodes differ by at least 1% relative to each other, preferably at least 3%.

In this embodiment, a planar photodiode array is produced.

FIG. 1 illustrates a photodiode array according to the invention, at different steps of its production, and according to sectional views along the plane (xOz). The axis (Oz) is parallel to the axis of the growth of the crystalline layers on a substrate 110, oriented from said crystalline layer in the direction of the substrate. The axis (Ox) is orthogonal to (Oz).

During a step preliminary to the implementation of the invention, a single semiconductor layer 120 made of semiconductor material of $Cd_xHg_{1-x}Te$ type is grown on the substrate 110. The substrate 110 is for example made of CdZnTe, or Si, or AsGa, or Ge. The growth is preferably carried out by liquid phase epitaxy, although molecular beam epitaxy is also possible.

The composition of the $Cd_xHg_{1-x}Te$ semiconductor layer is defined by x real comprised between 0 and 1, excluding the limits.

x is considered as initially constant, at least in planes orthogonal to the axis (Oz), and possibly in the entire volume of the semiconductor layer 120.

The semiconductor layer generally has a thickness comprised between 100 nm and 30 µm, preferably between 100 nm and 3 µm.

The semiconductor layer 120 is constituted of pixels 121. These pixels are regions of the semiconductor layer 120. These pixels are adjacent to each other. Preferably, they all have the same dimensions. In FIG. 1, the pixels 121 are delimited by vertical dash and dot lines. They each have for example a rectangular parallelepiped shape.

For the sake of brevity, FIG. 1 only illustrates three pixels.

Each pixel 121 receives a PN junction 141.

Each PN junction 141 separates an N or P doped casing 140, obtained by implantation or by diffusion of doping impurities, from the remainder of this semiconductor layer, P or N doped. The casing is specific to the photodiode and advantageously is flush on the upper face of the semiconductor layer 120. The upper face of the semiconductor layer is situated on the side opposite to the substrate 110.

The semiconductor layer 120 will thus form an optically active semiconductor layer.

The casings 140 are produced before, after or during the implementation of the steps of the method according to the invention. To facilitate understanding of the invention, they are however represented in FIG. 1.

In a first step 101 of the method according to the invention, a cadmium-rich material is deposited on the semiconductor layer 120, said cadmium-rich material being structured to form a cadmium-rich structure 170 on the semiconductor layer 120.

In particular, the cadmium-rich structure is deposited directly on the semiconductor layer 120, in direct physical contact with its upper face, on the side opposite to the substrate.

The structure 170 is called cadmium-rich because it has a cadmium concentration greater than that of the semiconductor layer 120.

In particular, the initial average cadmium concentration in the cadmium-rich material is greater than the initial average cadmium concentration in the semiconductor layer 120.

The cadmium-rich structure 170 is formed for example of a binary, ternary, or quaternary material, or even greater. This material advantageously comprises elements belonging to columns II and VI of the periodic table of elements. It is for example and in a non-limiting manner CdS, CdSe, CdTe, CdZnSe, CdMnSSe, etc.

The cadmium-rich structure 170 is called structured because it comprises through openings defining several portions of said structure.

The cadmium-rich structure 170 is constituted of portions 171, 172, 173, each surmounting a pixel 121 of the semiconductor layer.

In other words, each portion 171, 172, 173 is deposited directly on a respective pixel, in direct physical contact with its upper face, on the side opposite to the substrate. Each portion 171, 172, 173 only partially covers the corresponding pixel. Each portion 171, 172, 173 extends singly above the corresponding pixel, without extending out above a neighbouring pixel.

For reasons of legibility, in FIG. 1, the thickness along (Oz) of these portions 171, 172, 173 is highly exaggerated.

Each portion 171, 172, 173 has a thickness comprised between 10 nm and 10 μm, for example between 100 nm and 500 nm, preferably less than 300 nm.

In the example illustrated in FIG. 1, each pixel is surmounted by a portion of the cadmium-rich structure. In a variant, certain pixels are not surmounted by any portion of the cadmium-rich structure.

The portions 171, 172, 173 here have pad shapes, solid at the centre and each centred on a pixel 121, which all have the same initial cadmium concentration.

The centre of a pixel is defined as the centre of the volume occupied by this pixel.

These pads here have different thicknesses along (Oz), and the same section in a plane orthogonal to the axis (Oz), parallel to the upper face of the semiconductor layer 120. The pad 171 has a thickness $e_1$, the pad 172 a thickness $e_2$, and the pad 173 a thickness $e_3$, with $e_1<e_2<e_3$. These pads may each have a cylinder of revolution shape. Other shapes may be used, notably cylinders with non-circular base, square for example. The width of the pads, as a function of the pixel width, may for example be comprised between 300 nm and 10 μm, for a pixel width of 15 μm. Each pad may cover more than 50% of the upper face of a pixel 121.

Other examples of producing portions of the cadmium-rich structure will be described hereafter, such that pixels are surmounted by a different quantity of cadmium atoms, for example portions of different sections or of different initial concentrations. It is also possible to implement all possible combinations of thickness, section and initial concentration, such that at least one of these parameters varies from one pixel to the next. More complex productions may also be implemented thanks to several steps of deposition of cadmium-rich material, the initial cadmium concentration and/or the shape of the pads deposited at each deposition step being able to vary.

The cadmium-rich structure may have at least two types of portions that differ by their sections, thicknesses and/or initial concentrations, preferably at least two types. In a variant, all the portions forming the cadmium-rich structure are identical, and certain pixels of the semiconductor layer are not covered by any portion the cadmium-rich structure.

The cadmium-rich structure 170 may be produced by a photolithography technique known as lift-off. To do so, a layer of resin is deposited on the semiconductor layer 120. Then, the resin is locally etched, and a cadmium-rich material is deposited directly on the resin. In the places were the resin is developed, the cadmium-rich material is in direct contact with the semiconductor layer 120, and forms said portions 171, 172, 173. In the places where the resin is not developed, the cadmium-rich material extends onto the resin. The resin is then removed. The cadmium-rich material is only conserved in the place where it is in direct contact with the semiconductor layer 120.

The thickness of the resin layer is greater than or equal to the desired thickness of the cadmium-rich structure 170. It is possible to implement several cycles of deposition of resin, and deposition of cadmium-rich material, notably to produce pads of different thicknesses. Materials of different initial cadmium concentration could be used during successive depositions.

In a variant, the cadmium-rich structure may be produced by deposition of a cadmium-rich material directly on the semiconductor layer 120, followed by a local etching to only conserve the cadmium-rich material at certain spots. The etching step may use a resin mask, deposited on the cadmium-rich material. The cadmium-rich material may be etched by chemical etching through openings in the resin mask, for example by means of a bromine solution. Physical etching is also possible.

Once again, it is possible to implement several cycles of deposition of cadmium-rich material and etching, the cadmium-rich material not always being deposited at the same spots at each of said cycles.

At step 102, an annealing is carried out of the assembly formed of the semiconductor layer 120 and the cadmium-rich structure 170.

This annealing produces an inter-diffusion of cadmium atoms, between the atoms of cadmium of each portion 171, 172, 173 of the cadmium-rich structure, and the mercury atoms of the corresponding pixel.

Those skilled in the art will know how to adapt the temperature and the duration of the annealing so that at the end of the annealing, the pixels have different minimum cadmium concentrations.

The annealing is carried out preferably at a temperature comprised between 100° C. and 500° C., for a duration comprised between several minutes and several days.

The higher the initial cadmium concentration in the semiconductor layer 120, the higher the selected temperature and/or the longer the annealing duration.

Moreover, the temperature and the duration of the annealing increase with the thickness of the semiconductor layer 120.

Preferably, the annealing is carried out under saturated mercury vapour pressure. The annealing may be carried out one or more times. The annealing may also be carried out under vacuum. The inter-diffusion will then be slower (mechanism limited by the displacement of the mercury vacancies whereas under saturated mercury vapour pressure the mechanism is dominated by interstitial diffusion, a more rapid phenomenon).

The temperature and the duration of the annealing may also take into account the technological steps implemented to manufacture a photodiode array according to the invention, such that the pixels final photodiode array still have different minimum cadmium concentrations.

Moreover, the cadmium-rich structure and the annealing are adapted such that each portion of cadmium-rich structure has a thickness H, measured along the axis (Oz), such that:

$$H < L_d, \text{ with } L_d = \sqrt{D*t}$$

With $L_d$ the diffusion length of cadmium in the cadmium-rich structure 170, t the duration of the annealing, and D the coefficient of diffusion of cadmium in the cadmium-rich structure 170, which depends on the annealing temperature and the cadmium concentration. This coefficient of diffusion thus changes during annealing in the cadmium-rich structure 170 as well as in the semiconductor layer 120, on account of inter-diffusion.

This relation reflects the fact that it is necessary that each of the cadmium-rich pads has a thickness less than the diffusion length of cadmium atoms within these pads. In other words, the thickness of these pads may be defined as a thin layer vis-à-vis the diffusion length of cadmium.

For example, for a $Cd_xHg_{1-x}Te$ semiconductor layer 120 of thickness 3 μm, with initially x=0.22, and the implementation of a P/N type technology, i.e. the semiconductor layer 120 is N doped, the annealing is carried out at 300° C. for 40 hours, under saturated mercury vapour pressure, for cadmium-rich structures of 10 μm circular dimensions in the plane xOy and of 100, 200 and 300 nm thickness respectively (according to FIG. 1), for pixels with a pitch of 15 μm.

The annealing conditions are adapted such that at the end of the annealing, the pixels do not all have the same cutoff wavelength.

It may be considered that this cutoff wavelength is defined by the minimum cadmium concentration in the pixel.

In FIG. 1, is represented, at step 102, for each pixel and in a schematic manner, as a function of the depth z, the distribution at the end of the annealing of cadmium atoms from the cadmium-rich structure. In order to simplify the figure, the casings 140 are not illustrated at step 102.

It is considered that before the annealing 102, the pixels all have the same initial cadmium concentration $C_0$.

In a schematic manner, each portion 171, 172, 173 forms a finite reservoir of cadmium atoms available to diffuse into the pixel situated below. During annealing, the cadmium of each portion 171, 172, 173 diffuses into the corresponding pixel.

After annealing 102, the pixel situated under the portion 171 of the cadmium-rich structure has a minimum concentration $C_1$ associated with a cutoff wavelength $\lambda_1$, the pixel situated under the portion 172 has a minimum concentration $C_2$ associated with a cutoff wavelength $\lambda_2$, and the pixel situated under the portion 173 has a minimum concentration $C_3$ associated with a cutoff wavelength $\lambda_3$, with $C_1 < C_2 < C_3$.

The cadmium concentration in each pixel as a function of depth may have a shape of decreasing exponential, or complementary error, type.

According to a variant not represented, one of the pixels of the semiconductor layer is not covered by any portion of the cadmium-rich structure, such that the annealing step does not modify its minimum cadmium concentration and the associated cutoff wavelength.

At the end of annealing, what remains of the cadmium-rich structure may be conserved or removed.

When the PN junctions 141 are produced before production of the cadmium-rich structure and annealing, what remains of the cadmium-rich structure at the end of annealing may be conserved.

Preferably, the PN junctions are produced after production of the cadmium-rich structure and annealing. It is then preferred, before the implantation of dopant, to remove what remains of the cadmium-rich structure at the end of annealing.

Preferentially, these residues of cadmium-rich structures will be removed (to conserve better flatness of the array if need be).

It may be noted that the method according to the invention makes it possible to increase an average cadmium concentration at the level of the upper face of the semiconductor layer 120, which limits the appearance of conduction channels between the photodiodes. It is thus not necessary to eliminate these channels by other means. These conduction channels degrade the fidelity of the image formed, after reading of the photodiode array by a reading circuit. This increase in cadmium concentration at the level of the upper surface of the semiconductor layer 120 moreover makes it possible to reduce the appearance of pixel defects in low frequency noise of 1/f type, which is beneficial for an operation of the detector at higher temperatures.

The first embodiment of a method, as illustrated in FIG. 1, will advantageously be used for the manufacture of multi-spectral photodiode arrays of low pixel width, typically 15 μm and less.

Figure 2:
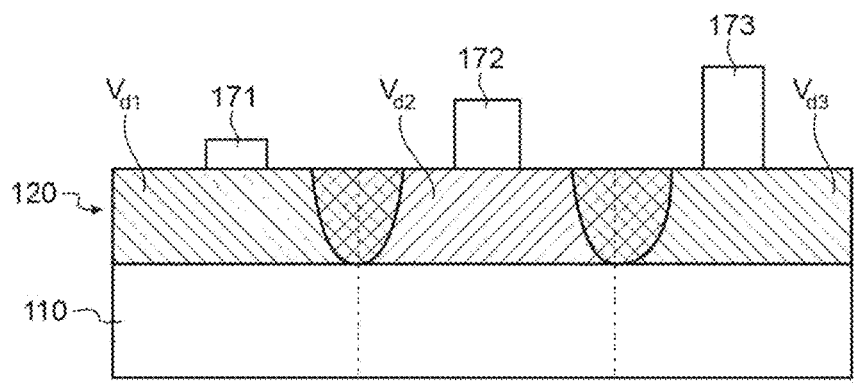
FIG. 2 schematically illustrates the diffusion of cadmium in the method represented in FIG. 1.

FIG. 2 schematically illustrates the diffusion of cadmium in the pads 171, 172, 173, in the method represented in FIG. 1.

The cadmium atoms of each pad 171, 172, 173, each diffuse in a respective diffusion volume situated in the corresponding pixel and being able to spread out also onto neighbouring pixels.

In the example represented in FIG. 2, each diffusion volume $V_{d1}$, $V_{d2}$, $V_{d3}$ encompasses a pixel and the edges of adjacent pixels.

Since each pad has a thickness less than the diffusion length of cadmium in said pad (condition $H < L_d$), the quantity of cadmium atoms coming from a pad of the cadmium-rich structure, and diffusing in the associated diffusion volume increases with the dimensions of said portion. In the example illustrated here, this quantity thus increases with the thickness of the pads.

Thus, the volume $V_{d1}$ receives a number $N_1$ of cadmium atoms, the volume $V_{d2}=V_{d1}$ receives a number $N_2>N_1$ of cadmium atoms, and the volume $V_{d3}=V_{d2}$ receives a number $N_3>N_2$ of cadmium atoms. The different cadmium concentrations $C_1$, $C_2$, $C_3$ described above are thus obtained.

Preferably, the cadmium atoms of each pad 171, 172, 173 diffuse substantially in the entire volume of the corresponding pixel (that is to say the pixel surmounted by said pad). In particular, they each diffuse in a diffusion volume encompassing said corresponding pixel, and being able to extend out onto neighbouring pixels. The ratio between the diffusion volume and the volume of the pixel may be comprised between 1 and 1.2.

In other words, the annealing is then adapted so that the cadmium of a portion of the cadmium-rich structure diffuses substantially in the entire volume of the pixel situated below.

It is not however necessary that the diffusion volume is greater than or equal to the volume of a pixel so that the minimum cadmium concentration varies from one pixel to the next. In fact, an inter-diffusion of cadmium can take place during the growth of the semiconductor layer 121 on a substrate comprising cadmium, which increases the cadmium concentration in the entire bottom of the semiconductor layer 121. For this reason, the cadmium concentration in a pixel may be minimum in a zone of the pixel, situated at a depth z<Z0, with Z0 the thickness of the semiconductor layer 120, thus not necessarily at the interface with the substrate 110.

According to an advantageous embodiment, the diffusion volume is equal to the volume of a pixel. In other words, the cadmium of a portion of the cadmium-rich structure diffuses in the entire volume of the pixel situated below without extending out onto neighbouring pixels.

In this case, the thickness of the semiconductor layer 120 may be substantially equal to half of a minimum distance between two neighbouring portions of the cadmium-rich structure (taken among all the possible pairings).

The temperature and the duration of the annealing are moreover adapted, such that the diffusion length of cadmium laterally is equal to the diffusion length of cadmium in depth and equal to the thickness of the semiconductor layer 120.

In a variant, the lateral diffusion length of cadmium is equal to half the minimum distance between two neighbouring portions of the cadmium-rich structure, and the thickness of the semiconductor layer 120 is less than said half. A diffusion volume equal to the volume of a pixel is again obtained, because as a first approximation the diffusion of cadmium in depth is stopped at the interface with the substrate 110.

Figure 3:
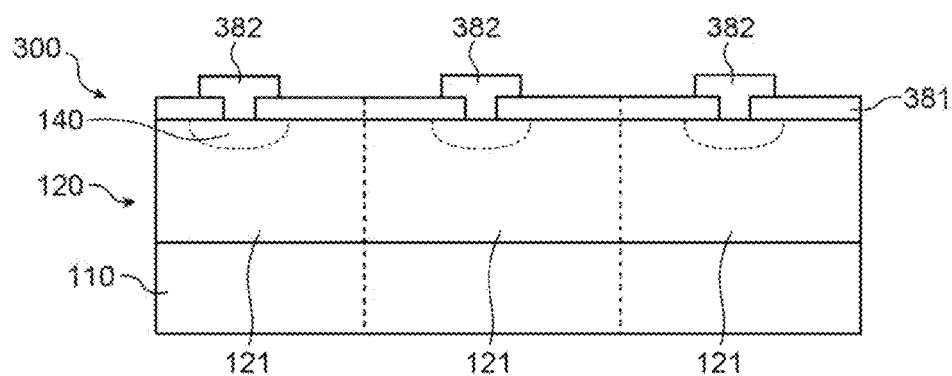
FIG. 3 schematically illustrates a photodiode array obtained by means of the method represented in FIG. 1.

FIG. 3 schematically illustrates a photodiode array 300, obtained by means of the method represented in FIG. 1.

The pads 171, 172, 173 have been removed after the step of inter-diffusion annealing.

Casings 140 as mentioned with reference to FIG. 1 have been produced after having removed these pads.

The lateral dimension of the casings 140 is advantageously of the order of a pixel width less 4 to 5 µm, for example 11 µm for a pixel width of 15 µm. This makes it possible to improve the modulation transfer function of the pixel. The PN junction extends down to around 1 µm under the upper surface of the semiconductor layer 120.

The semiconductor layer 120 is covered by a passivation layer 381, open above each casing to allow a metal connector 382 to pass.

The width of a metal connector 382 is advantageously of the order of magnitude of the width of a casing, or even slightly less than 1 to 2 µm, for example 10 µm for a pixel width of 15 µm. This makes it possible to improve the quantum yield of the pixel while avoiding surface inversions between the passivation and the semiconductor layer 120, specific to the presence of a MIS (Metal-Insulator-Semiconductor) structure of which the metallisation is reverse polarised in the normal operating mode of the photodiode.

Although it is represented in FIG. 3, the substrate may be removed before, during or after the implementation of the steps of the method according to the invention.

There exists in the array 300 at least two photodiodes each having a different cutoff wavelength. The array 300 is thus multi-spectral.

The difference between their respective minimum cadmium concentrations is greater than 3% of the maximum value, or even 5%, and even 10%.

Preferably, the different types of photodiodes, which differ by their cutoff wavelength, are distributed regularly in space.

They may notably be distributed according to a periodic layout of the different types of photodiodes, with an elementary pattern comprising at least one photodiode of each type.

This corresponds to a cadmium-rich periodic structure, of which the elementary pattern extends above a plurality of pixels of the semiconductor layer and has at least one portion of each type (each portion surmounting a single pixel, and the portions of each type are distinguished from each other by their volume and/or their initial concentration). An elementary pattern of the periodic structure may extend above a plurality of pixels of the semiconductor layer, among which at least one pixel is not surmounted by any portion of the cadmium-rich structure.

The photodiodes of the array, respectively the portions of the cadmium-rich structure, are then distributed into groupings of photodiodes, respectively groupings of portions, each grouping corresponding to an elementary pattern.

For example, the different types of photodiodes, respectively the different types of portions of the cadmium-rich structure, are distributed according to a Bayer type array.

Thus, all the types of photodiodes are not necessarily present in the same number, and the proportion of each type of photodiode makes it possible to give more or less weight to certain wavelength ranges.

The different types of photodiodes differ by their cutoff wavelength, each photodiode supplying a wide band signal that extends as a first approximation from zero (if the substrate has been removed) to the cutoff wavelength of the pixel.

In operation, the signals of all the photodiodes of the array are read at the same time.

The signals associated with photodiodes of a same grouping may be combined together, for example to subtract them two by two, in order to have available short band signals.

For example, with an array with three types of photodiodes supplying the signals $S_0$, $S_1$ and $S_2$, of respective cutoff wavelengths $\lambda_0>\lambda_1>\lambda_2$, a bi-spectral detector with small band width is produced by means of the signals $S_1-S_2$ and $S_0-S_1$.

In a variant, with an array with two types of photodiodes supplying the signals $S_0$ and $S_1$, of respective cutoff wavelengths $\lambda_0>\lambda_1$, a bi-spectral detector with the wide band signal $S_1$ and the short band signal $S_0-S_1$ is produced.

According to another variant, with an array with three types of photodiodes supplying the signals $S_0$, $S_1$ and $S_2$, of respective cutoff wavelengths $\lambda_0>\lambda_1>\lambda_2$, a tri-spectral detector is produced by means of the signals $S_2$, $S_1-S_2$ and $S_0-S_1$.

According to another variant, with an array with four types of photodiodes supplying the signals $S_0$, $S_1$, $S_2$ and $S_3$, of respective cutoff wavelengths $\lambda_0 > \lambda_1 > \lambda_2 > \lambda_3$, a short band tricolour detector is produced by means of the signals $S_2$-$S_3$, $S_1$-$S_2$ and $S_0$-$S_1$.

The principle of these variants may be extended without limit to cases of multi-spectral detection with even more bands according to the needs of the product.

Figure 4:
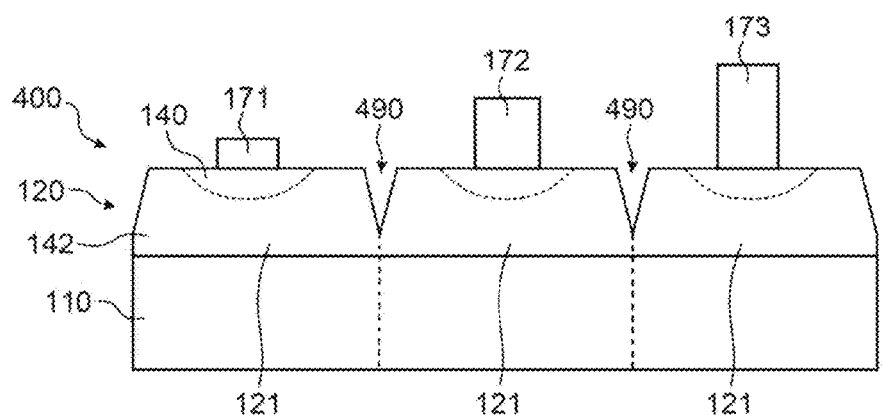
FIG. 4 illustrates a variant of the method and of the photodiode array illustrated in FIGS. 1 to 3.

FIG. 4 illustrates a variant of the method and of the photodiode array illustrated in FIGS. 1 to 3.

The array 400 illustrated in FIG. 4 differs from the embodiment described previously in that it does not have a planar structure, but a mesa structure.

The mesa structure pre-exists the implementation of the method according to the invention. This type structure offers a better quality of the modulation transfer function.

Each photodiode has a PN junction between a casing 140 having a P or N doping, and a soleplate 142 having a doping of opposite N or P nature.

Here, the trenches 490 separating neighbouring photodiodes do not extend over the entire thickness of the semiconductor layer 120, in order to offer an electrical continuity between the soleplates of the different photodiodes of the array. It is thus possible to polarise simultaneously all the soleplates of the photodiodes, by means of an electrode offset generally on the periphery of the array.

The ratio between the depth of the trenches along the axis (Oz) and the maximum thickness of the semiconductor layer 120 along this same axis is for example comprised between 0.8 and 0.9.

This variant makes it possible to obtain very easily diffusion volumes of each portion of the cadmium-rich structure, substantially equal to the volume of a pixel of the semiconductor layer 120. In particular, the diffusion volume may be comprised between 1 and 1.1 times the volume of the pixel.

FIG. 4 illustrates more particularly the array obtained directly at the end of the inter-diffusion annealing. In the final product, the semiconductor layer is covered by a passivation layer, open above each PN junction to allow a metal connector to pass. The residues of the cadmium-rich structure may have been removed.

Figure 5A:
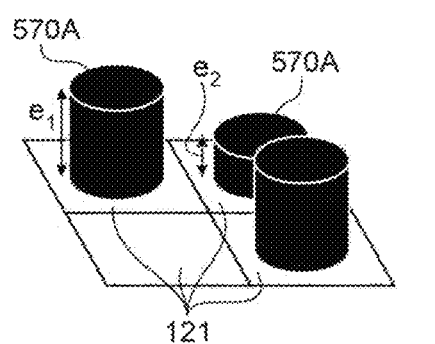
FIGS. 5A, 5B, and 6, illustrate two variants of a cadmium-rich structure according to the invention.
Figure 5B:
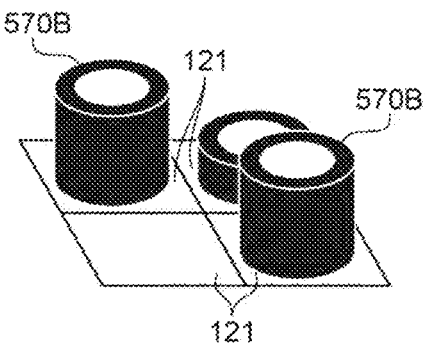

FIGS. 5A and 5B illustrate examples of cadmium-rich structures, having portions of different thicknesses and same initial cadmium concentration.

A perspective view of a grouping of photodiodes as defined above has in particular been represented. The pixels 121 of the semiconductor layer are delimited by dotted lines.

In FIG. 5A, the cadmium-rich structure is constituted of pads 570A each centred on a pixel 121, in the shape of cylinders of revolution of same diameters.

For example, two pixels 121 are surmounted by respective pads of thickness $e_1$, and a third pixel 121 is surmounted by a pad of thickness $e_2$. A fourth pixel is not covered by a pad of the cadmium-rich structure.

The pads are centred on the centre of the PN junctions of each photodiode. They may be of diameter greater than, less than or equal to the width of the PN junction.

According to a variant not represented, the cadmium-rich structures are in the shape of rectangular parallelepipeds with square base of different thicknesses, and centred on the centre of the PN junctions of each photodiode.

This embodiment, in which the cadmium-rich structure is constituted of solid pads, is particularly adapted to arrays with low pixel pitch.

FIG. 5B illustrates a variant in which the pads 570B are open at the centre and spaced apart from each other. They each have a tube shape, that is to say a cylinder of revolution open at the centre, the opening being in the form of a concentric cylinder of revolution and of same height.

The tubes have the same internal and external diameters, and different thicknesses.

They are centred on the centre of the PN junctions of each photodiode. The opening may be of diameter either smaller than, greater than or equal to the diameter of each PN junction, and even of diameter greater than the diameter of the space charge zones.

According to a variant not represented, the cadmium-rich structures are in the shape of rectangular parallelepipeds with square base open at the centre, the opening also being in the shape of rectangular parallelepipeds, of same thickness.

This embodiment, in which the cadmium-rich structure is constituted of pads open at the centre, also makes it possible to improve a modulation transfer function of the photodiode array. The width of these tubes will then be advantageously less than 2 µm.

Figure 6:
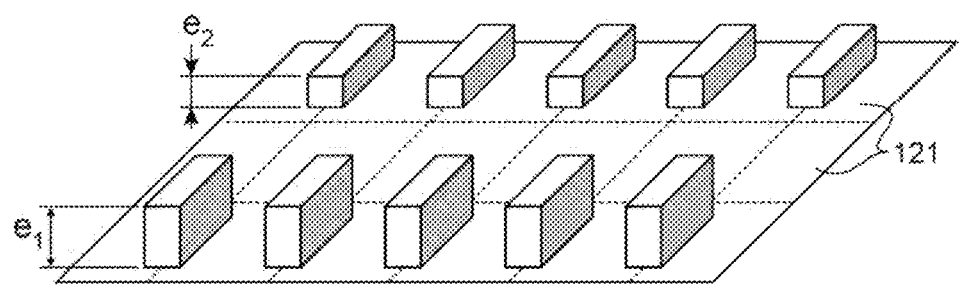

FIG. 6 illustrates another example of cadmium-rich structure implemented in the method described above. In this example, the portions of cadmium-rich structure, each associated with a pixel 121 of the semiconductor layer, are not centred on the associated pixel. They are moreover formed of a single piece two by two, centred on the intersection between two neighbouring pixels. They all have the same initial cadmium concentration.

Along each line of pixels 121, each intersection between two neighbouring pads is surmounted by a pad of height $e_1$, or a pad of height $e_2$, or no pad.

FIG. 6 illustrates in particular a variant according to which there are two possible geometries for the pads, and certain pixels of the semiconductor layer are not covered by any portion of the cadmium-rich structure.

Numerous other forms may be implemented without going beyond the scope of the present invention (variable thickness and geometry according to the pixels).

Figure 7:
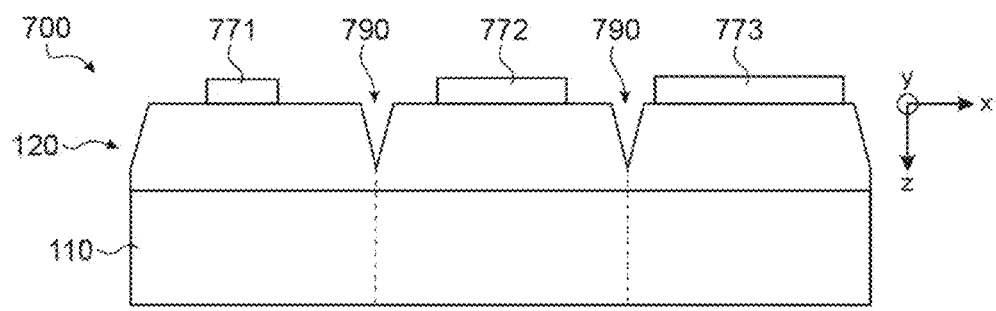
FIG. 7 schematically illustrates a second embodiment of the method and of the photodiode array according to the invention.

FIG. 7 schematically illustrates a second embodiment of a method and a photodiode array 700 according to the invention, which will only be described for its differences relative to the first embodiment.

In the example illustrated in FIG. 7, the semiconductor layer 120 has a mesa structure, as illustrated in FIG. 4.

The portions 771, 772, 773 of the cadmium-rich structure have this time all the same thickness along (Oz), but different sections in a plane orthogonal to the axis (Oz) (and the same initial cadmium concentration).

This embodiment is particularly advantageous since, thanks to the trenches 790, the diffusion volume associated with each portion 771, 772, 773 is substantially the same, as in the case of the photodiode array 400. In fact, these trenches limit the lateral diffusion of cadmium in each pixel of the semiconductor layer. Another advantage of this embodiment is that the portions of cadmium-rich structures may here be deposited in a single step, without having to resort to successive photolithographies and depositions as in the case described previously. This simplifies the production of the multi-spectral photodiode array.

FIG. 7 illustrates more particularly the array obtained directly at the end of the inter-diffusion annealing. In the final product, the semiconductor layer is covered by a passivation layer, open above each PN junction to allow a metal connector to pass. The residues of the cadmium-rich structure may have been removed.

It is possible to combine the embodiments of FIGS. 7 and 4, to produce portions of cadmium-rich structure having different thicknesses and different sections, from one pixel to the next of the semiconductor layer.

Figure 8:
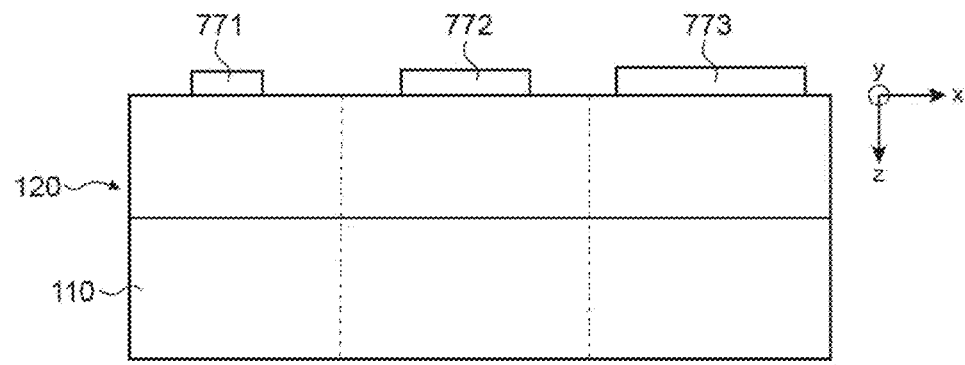
FIG. 8 illustrates a variant of the method and of the photodiode array illustrated in FIG. 7.

FIG. 8 schematically illustrates a variant of the method and the photodiode array illustrated in FIG. 7, in which the array 800 does not have a mesa structure but a planar structure.

Those skilled in art could also combine the embodiments of FIGS. 8 and 1, to produce portions cadmium-rich structure having different thicknesses and different sections, from one pixel to the next of the semiconductor layer.

FIGS. 9A to 9E illustrate different variants of a cadmium-rich structure according to the invention, having portions of different sections.

Figure 9A:
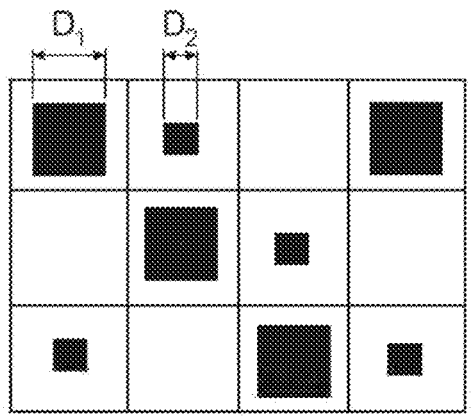
FIGS. 9A to 9E illustrate different variants of a cadmium-rich structure according to the invention.

FIG. 9A illustrates, in top view, a series of twelve photodiodes.

The cadmium-rich structure constituted of pads (in black). Each pad is a rectangular parallelepiped with square base, centred on a photodiode and solid at the centre. All the pads have the same thickness. All the pads do not have the same section. A first type of pad has a square base of side $D_1$, and a second type of pad has a square base of side $D_2<D_1$. Certain photodiodes are not surmounted by a portion of cadmium-rich structure.

The pads have a periodic layout, with a periodic pattern extending over a square surface of three photodiodes by three photodiodes.

Figure 9B:
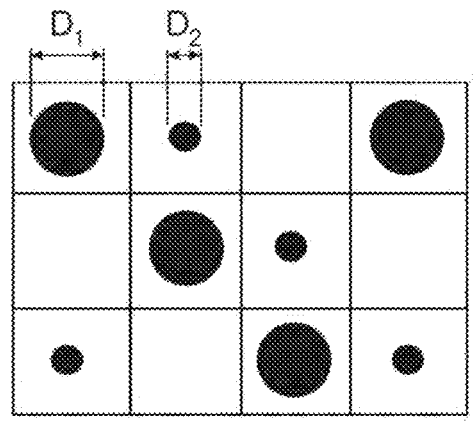

FIG. 9B only differs from FIG. 9A in that the pads have shapes of cylinders of revolution of diameters $D_1$ or $D_2<D_1$.

The embodiments of FIGS. 9A and 9B are particularly advantageous for small pixel pitches of the photodiode array.

Figure 9C:
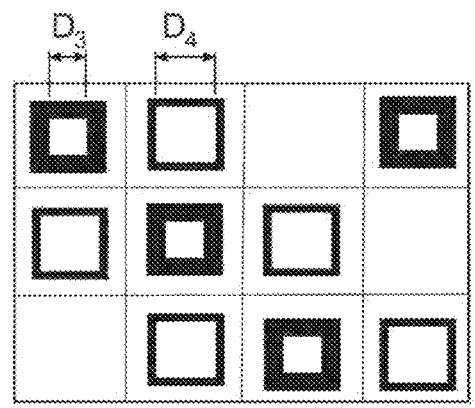

FIG. 9C only differs from FIG. 9A in that the pads all have the same external dimensions, and are traversed at the centre by a through opening. (The distribution pattern of the pads also differs very slightly). Each pad has a section in a plane orthogonal to (Oz) in the shape of a square with wide edges. All the pads have external dimensions defined by a rectangular parallelepiped with square base of side $D_1$. A first type pad has a through opening in the shape of a rectangular parallelepiped of square base of side $D_3$. A second type of pad has a through opening in the shape of a rectangular parallelepiped of square base of side $D_4>D_3$.

Figure 9D:
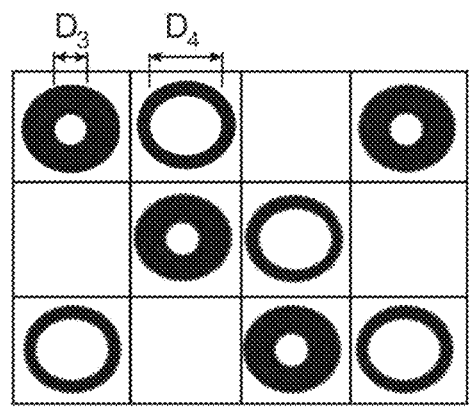

FIG. 9D only differs from FIG. 9C in that the pads and the through openings are each in the shape of cylinder of revolution centred on a photodiode. (The distribution pattern of the pads corresponds to that of FIG. 9D).

The embodiments of FIGS. 9C and 9D make it possible to produce a photodiode array with improved MTF. The widths of these tubes will then be advantageously less than 2 μm.

Figure 9E:
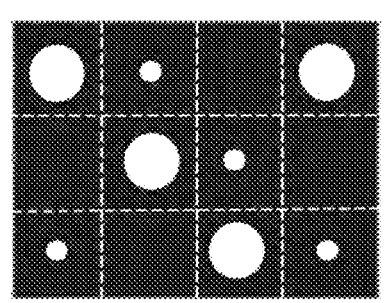

In another variant illustrated in FIG. 9E, the cadmium-rich structure is constituted of three types of pads each associated with a photodiode. Each pad has external dimensions that correspond to those of the upper face of a photodiode. A first type of pad is solid at the centre. A second type of pad is traversed by a cylindrical through opening centred on a photodiode and of first diameter. A third type of pad is traversed by a cylindrical through opening centred on a photodiode and of second diameter. All the pads are formed of a single piece so as to constitute a grid.

Numerous other shapes may be implemented without going beyond the scope of the present invention.

A method has been described above comprising a single cycle of:
deposition of cadmium-rich material, to form a cadmium-rich structure on the semiconductor layer; and
inter-diffusion annealing.

In a variant, the method may comprise several cycles of deposition of cadmium-rich material and inter-diffusion annealing.

The several steps of deposition of cadmium-rich material define together a step of producing a cadmium-rich structure according to the invention.

The several steps of inter-diffusion annealing are then named partial annealings. It may be considered that these partial annealings together define a single inter-diffusion annealing called fractionated, at the end of which all pixels of the semiconductor layer do not have the same cutoff wavelength. In other words, the partial annealings are adapted such that, at the end these partial annealings, all the pixels of the semiconductor layer do not have the same cutoff wavelength.

Figure 10A:
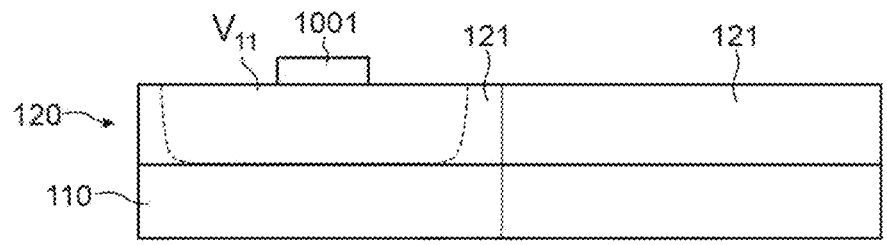
FIGS. 10A and 10B schematically illustrate a third embodiment of the method according to the invention.
Figure 10B:
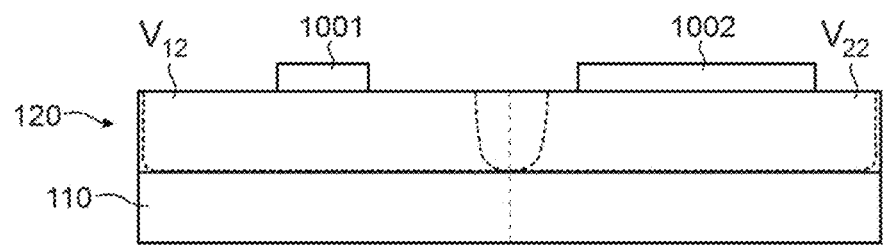

FIGS. 10A and 10B schematically illustrate a third embodiment of method according to the invention, corresponding to this variant of the invention.

In this embodiment, steps of deposition of cadmium-rich material and inter-diffusion annealing, called partial annealing, are successively carried out.

The series of partial annealings form the inter-diffusion annealing according to the invention. The series of depositions of cadmium-rich material forms the production of a cadmium-rich structure according to the invention.

Each deposition of cadmium-rich material may comprise the deposition of pads of same thickness, deposited at different places on the semiconductor layer before each partial annealing. The residue of the pads may be removed, or conserved after a partial annealing. Thus, a pad may be superimposed, entirely or partially, on a pad having been previously deposited and annealed. Pads of same thicknesses may have different sections, or the same sections.

The diffusion volume at the end of each partial annealing may be less than or equal to the volume of the pixel.

At the end of the realisation, depending on the number of partial annealing(s) and cadmium-rich pad(s) that a pixel will have seen, its minimum cadmium concentration will be more or less high.

This embodiment is particularly advantageous with a planar semiconductor layer.

However, advantageously, a single deposition of cadmium-rich structure will be carried out so as to simplify the manufacturing method.

FIGS. 10A to 10B illustrate an example of method comprising several partial inter-diffusion annealings for controlling the total quantity of cadmium entering into the pixels 121 of a planar structure.

During a first cycle (FIG. 10A), a first deposition of cadmium-rich material is carried out. The pad 1001 is deposited centred on the pixel 121, on the left of the figure. The upper face of the pixel on the right of the figure is left free. A first partial annealing is carried out. At the end of this first annealing, the cadmium atoms of the pad 1001 have diffused in an intermediate diffusion volume $V_{11}$.

During a second cycle (FIG. 10B), a pad 1002 is added above the pixel 121 on the right in the figure. The pad 1002 has a section much wider than the pad 1001. A second partial annealing is carried out. At the end of this second annealing, the cadmium atoms of the pad 1001 have continued to diffuse in the pixel on the left, to extend finally into the total diffusion volume $V_{12}$, and the cadmium atoms of the pad 1002 have diffused in the total diffusion volume $V_{22}$. The volumes $V_{12}$ and $V_{22}$ are substantially equal to each other, and substantially equal to the volume of a pixel of the semiconductor layer.

The first partial annealing and the second partial annealing together form an inter-diffusion annealing as described previously, here fractionated into two partial annealings, at the end of which the pixel on the left and the pixel on the right in FIGS. 10A and 10B do not have the same cutoff wavelength.

This embodiment notably makes it possible to obtain diffusion volumes substantially equal for each pixel, despite the cadmium-rich pads of which the section may differ considerably from one pixel to the next.

In a variant, it is possible to implement successive depositions of materials initially more or less rich in cadmium, followed by inter-diffusion annealing(s) that those skilled in the art will know how to adapt to obtain different cutoff wavelengths from one pixel to another pixel, these pixels being preferably spread out in a periodic manner at the scale of the array as described previously.

Whatever the embodiment, the semiconductor layer 120 is preferably very thin, for example less than the diffusion length of the minority carriers therein. The inter-diffusion annealing is adapted in consequence. A reduced thickness makes it possible to reduce MTF since the probability that a photo-carrier diffuses in the neighbouring pixel is reduced. Moreover, the dark current is further reduced. In the particular case of a mesa structure, the trenches to etch are less deep and thus easier to produce; thus the dark current will be potentially less degraded that for a deeper etching. Finally, a semiconductor layer of low thickness makes it possible to obtain larger variations in the cutoff wavelength within a same array.

Figure 11A:
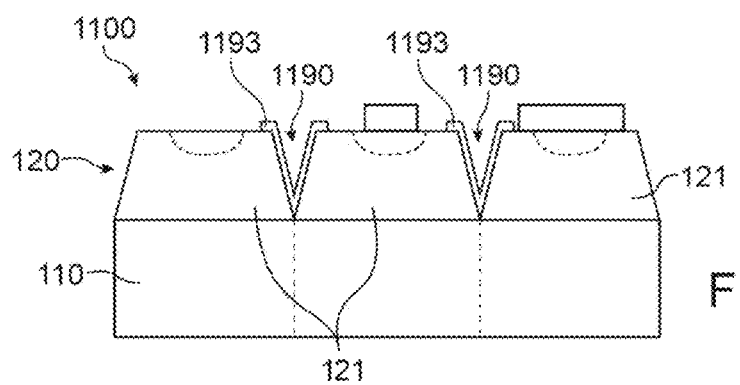
FIGS. 11A, 11B and 11C schematically illustrate two variants of methods and photodiode arrays illustrated in FIGS. 4 and 7.
Figure 11B:
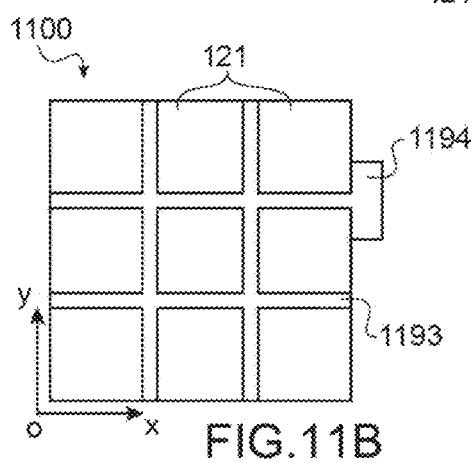

FIGS. 11A and 11B schematically illustrate a variant of the methods and photodiode arrays illustrated in FIGS. 4 and 7.

According to this variant, the array 1100 has a mesa structure, in which the trenches 1190 separating the photodiodes extend over the entire thickness of the semiconductor layer 120, down to the substrate 110.

The array then has an excellent MTF. Moreover, the diffusion volume of cadmium from each portion of cadmium-rich structure is limited to the pixel situated below. It is possible to use longer annealings and/or higher temperatures, making it possible to obtain in each pixel a homogeneous concentration of cadmium and distinct from the cadmium concentration of a neighbouring pixel. Finally, it is possible to obtain more easily greater variations in the cutoff wavelength within a same array.

FIG. 11A represents a sectional view of said array. FIG. 11B represents a top view.

In order to re-establish an electrical contact between the soleplates of each photodiode, and to have an electrical continuity between them, metallisations 1193 are produced in the trenches. Each metallisation is constituted of a thin layer of metal, electrically conducting, covering the bottom of the trenches. In the example represented in the figures, the metallisations extend over the entirety of the internal faces of these trenches, and slightly extend out onto the upper face of the semiconductor layer 120, parallel to the plane (xOy). The metallisations together form a continuous grid extending between the photodiodes, and connected to an electrode 1194 offset on the periphery of the array.

In this embodiment, the space charge zone surrounding the PN junctions must be situated at a distance from the edges of the metallisations, to avoid a short-circuit.

Figure 11C:
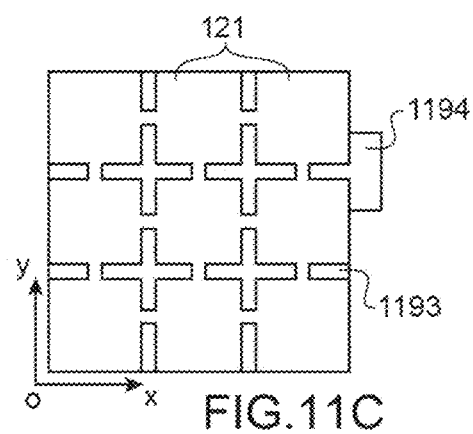

A variant to this embodiment consists in eliminating the continuity of this metal grid so as to relax potential mechanical stresses induced by the deposition of a metal layer (FIG. 11C), while assuring a low series resistance at the scale of the array. In practice, a very small rectangle is cut over the entire width of a metal line, to form an opening of the order of a micron for example (exaggerated in FIG. 11C for illustration purposes). This will be particularly advantageous for large formats of arrays of photodiodes.

Finally a last variant of this embodiment consists in doing without metallisations in the trenches, and rather in using substrate doping that is stronger locally (n+ or p+ according to the type of junction, obtained for example by implantation) to assure a low series resistance at the scale of the array. The substrate contact pick up metallisation then extends uniquely in the periphery of the array. This variant makes it possible to produce a photodiode array with very small pixel widths (<15 μm) for which it would be difficult to deposit a metallisation in the trenches.

The invention claimed is:

1. A method for manufacturing a multispectral photodiode array in a $Cd_xHg_{1-x}Te$ semiconductor layer constituted of juxtaposed regions called pixels, the method comprising a step of producing a PN junction in each pixel, wherein the following steps are implemented at least once:
   deposition of cadmium-rich material on the $Cd_xHg_{1-x}Te$ semiconductor layer so as to produce a cadmium-rich structure comprising separate portions on the $Cd_xHg_{1-x}Te$ semiconductor layer, the cadmium-rich material having a cadmium concentration greater than that of the semiconductor layer; then
   inter-diffusion annealing, realising the diffusion of cadmium atoms from the portions of the cadmium-rich material to the semiconductor layer;
   wherein
   in the cadmium-rich structure, each separate portion at least partially covers different single pixel, wherein the cadmium-rich structure has at least two types of portions that differ by their respective volumes, thicknesses and/or initial concentrations or wherein all the portions of the cadmium-rich structure are identical and some pixels are not at least partially covered by a portion of the cadmium-rich structure; and
   at least one inter-diffusion annealing being adapted so that at the end of the at least one inter-diffusion annealing, all the pixels do not have the same cutoff wavelength.

2. The method according to claim 1, wherein the portions at least partially covering a pixel are each centered on the pixel.

3. The method according to claim 2, wherein each portion of the cadmium-rich structure has a pad shape, which is solid at the centre and each pad shaped portion is spaced apart from the pad shaped portions of neighboring pixels.

4. The method according to claim 2, wherein each portion of the cadmium-rich structure has a pad shape, which is open at the centre and each pad shaped portion is spaced apart from the pad shaped portions of neighboring pixels.

5. The method according to claim 1, wherein portions of the cadmium-rich structure at least partially covering neighboring pixels have different thicknesses.

6. The method according to claim 1, wherein the portions of the cadmium-rich structure at least partially covering neighboring pixels have different shapes.

7. The method according to claim 1, wherein the portions of the cadmium-rich structure at least partially covering neighboring pixels have portions of different initial concentrations.

8. The method according to claim 1, wherein the portions of the cadmium-rich structure at least partially covering neighboring pixels have a pattern which is periodic across a plurality of the pixels of the semiconductor layer.

9. The method according to claim 1, comprising multiple cycles of deposition of cadmium-rich material on the semiconductor layer, then inter-diffusion annealing.

10. The method according to claim 1, wherein the semiconductor layer has a mesa structure in which trenches separating neighbouring photodiodes extend over the entire height of said semiconductor layer, and the method further comprises a metallisation of these trenches, producing an electrical connection between the photodiodes.

11. The method according to claim 1, wherein the semiconductor layer has a mesa structure in which trenches separating neighbouring photodiodes do not extend over the entire height of said semiconductor layer, so as to preserve electrical continuity between the photodiodes.

12. A multi-spectral photodiode array obtained by a method according to claim 1, in which the semiconductor layer comprises at least two types of pixels which differ by their cutoff wavelength.

13. A method for manufacturing a multispectral photodiode array in a $Cd_xHg_{1-x}Te$ semiconductor layer constituted of juxtaposed regions called pixels, the method comprising a step of producing a PN junction in each pixel, wherein the following steps are implemented at least once:
deposition of cadmium-rich material on the $Cd_xHg_{1-x}Te$ semiconductor layer so as to produce a cadmium-rich structure comprising portions on the $Cd_xHg_{1-x}Te$ semiconductor layer, the cadmium-rich material having a cadmium concentration greater than that of the semiconductor layer; then
inter-diffusion annealing, realising the diffusion of cadmium atoms from the portions of the cadmium-rich material to the semiconductor layer;
wherein
in the cadmium-rich structure, each portion at least partially covers different single pixel, wherein the cadmium-rich structure has at least two types of portions that differ by their respective volumes, thicknesses and/or initial concentrations or wherein all the portions of the cadmium-rich structure are identical and some pixels are not at least partially covered by a portion of the cadmium-rich structure; and
at least one inter-diffusion annealing being adapted so that at the end of the at least one inter-diffusion annealing, all the pixels do not have the same cutoff wavelength,
wherein the portions at least partially covering a pixel are each centered on the pixel, and
wherein the portions of the cadmium-rich structure on different pixels together form a grid having openings each centred on the pixel.

14. A method for manufacturing a multispectral photodiode array in a $Cd_xHg_{1-x}Te$ semiconductor layer constituted of juxtaposed regions called pixels, the method comprising a step of producing a PN junction in each pixel, wherein the following steps are implemented at least once:
deposition of cadmium-rich material on the $Cd_xHg_{1-x}Te$ semiconductor layer so as to produce a cadmium-rich structure comprising m rising portions on the $Cd_xHg_{1-x}Te$ semiconductor layer, the cadmium-rich material having a cadmium concentration greater than that of the semiconductor layer; then
inter-diffusion annealing, realising the diffusion of cadmium atoms from the portions of the cadmium-rich material to the semiconductor layer;
wherein
in the cadmium-rich structure, each portion at least partially covers different single pixel, wherein the cadmium-rich structure has at least two types of portions that differ by their respective volumes, thicknesses and/or initial concentrations or wherein all the portions of the cadmium-rich structure are identical and some pixels are not at least partially covered by a portion of the cadmium-rich structure; and
at least one inter-diffusion annealing being adapted so that at the end of the at least one inter-diffusion annealing, all the pixels do not have the same cutoff wavelength,
wherein the portions of the cadmium-rich structure are decentered relative to the corresponding at least partially covered pixel and several portions of the cadmium-rich structure of neighboring pixels form a single piece of the cadmium-rich structure.

* * * * *